(12) United States Patent
Hagihara et al.

(10) Patent No.: US 7,402,372 B2
(45) Date of Patent: *Jul. 22, 2008

(54) POSITIVE RESIST COMPOSITION AND METHOD OF FORMING RESIST PATTERN

(75) Inventors: Mitsuo Hagihara, Kawasakai (JP); Taku Nakao, Kawasakai (JP); Kazuyuki Nitta, Kawasaki (JP)

(73) Assignee: Tokyo Ohka Kogyo Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/865,040

(22) Filed: Jun. 10, 2004

(65) Prior Publication Data
US 2005/0042541 A1   Feb. 24, 2005

(30) Foreign Application Priority Data
Jun. 13, 2003   (JP) ............ P 2003-169833

(51) Int. Cl.
*G03F 7/004*   (2006.01)

(52) U.S. Cl. .............. 430/270.1; 430/905; 430/910

(58) Field of Classification Search .......... 430/270.1, 430/905, 910, 326, 170
See application file for complete search history.

(56) References Cited

U.S. PATENT DOCUMENTS

| | | | |
|---|---|---|---|
| 5,942,367 A | 8/1999 | Watanabe et al. | |
| 5,976,759 A | 11/1999 | Urano et al. | |
| 6,033,826 A | 3/2000 | Urano et al. | |
| 6,143,460 A * | 11/2000 | Kobayashi et al. | 430/170 |
| 6,432,608 B1 | 8/2002 | Fujie et al. | |
| 6,593,056 B2 | 7/2003 | Takeda et al. | |
| 6,627,381 B1 * | 9/2003 | Uetani et al. | 430/270.1 |
| 6,656,660 B1 * | 12/2003 | Urano et al. | 430/270.1 |
| 6,723,483 B1 * | 4/2004 | Oono et al. | 430/170 |
| 6,846,609 B2 | 1/2005 | Uetanie et al. | |
| 6,953,651 B2 | 10/2005 | Namba et al. | |
| 7,005,230 B2 | 2/2006 | Yamamoto et al. | |
| 2002/0164540 A1 | 11/2002 | Nakanishi et al. | |
| 2005/0042541 A1 | 2/2005 | Hagihara et al. | |
| 2006/0251986 A1 | 11/2006 | Sato et al. | |

FOREIGN PATENT DOCUMENTS

| | | | |
|---|---|---|---|
| EP | 1 357 284 | | 8/2002 |
| GB | 2 356 258 | | 5/2001 |
| JP | HEI 4-211258 | | 8/1992 |
| JP | 06-69118 | | 3/1994 |
| JP | 8-254820 | | 10/1996 |
| JP | 11-119443 | | 4/1999 |
| JP | 11-168052 | | 6/1999 |
| JP | 2000-26535 | | 1/2000 |
| JP | 2000-188250 | | 7/2000 |
| JP | 2000-227658 | | 8/2000 |
| JP | 2000-356850 | | 12/2000 |
| JP | 2001-274062 | | 10/2001 |
| JP | 2002-241442 | | 1/2002 |
| JP | 2002-287363 | | 10/2002 |
| WO | WO-0046640 | * | 8/2000 |
| WO | WO 01/73512 | | 10/2001 |

* cited by examiner

*Primary Examiner*—John S Chu
(74) *Attorney, Agent, or Firm*—Knobbe, Martens, Olson & Bear LLP

(57) ABSTRACT

A positive resist composition includes a resin (A) that increases alkali solubility due to action of an acid, wherein the resin comprises a copolymer containing a first structural unit (a1) derived from hydroxystyrene, and a second structural unit (a2) derived from a (meth)acrylate with an alcoholic hydroxyl group, and a weight average molecular weight of the copolymer is within a range from 2000 to 8500, and 10 mol % to 25 mol % of a combined total of hydroxyl groups within the structural units (a1) and alcoholic hydroxyl groups within the structural units (a2) are protected with acid dissociable, dissolution inhibiting groups, an acid generator (B) that generates an acid on exposure to light, and polypropylene glycol (C).

12 Claims, No Drawings

POSITIVE RESIST COMPOSITION AND METHOD OF FORMING RESIST PATTERN

BACKGROUND OF THE INVENTION

1. Field of the Invention

The present invention relates to a positive resist composition and a method of forming a resist pattern. Priority is claimed on Japanese Patent Application No. 2003-169833, filed Jun. 13, 2003, the content of which is incorporated herein by reference.

2. Background Art

In recent years, in the production of semiconductor elements and liquid crystal display elements, advances in lithography techniques have lead to rapid progress in the miniaturization of semiconductor elements and liquid crystal display elements. Typically, these techniques for achieving further miniaturization involve shortening of the wavelength of the exposure light source. Until recently, ultraviolet radiation such as g-lines and i-lines have been used as the exposure light source, but recently, mass production using KrF excimer lasers (248 nm) has been started, and even ArF excimer lasers (193 nm) are now starting to be introduced. Radiation of even shorter wavelengths such as $F_2$ excimer lasers (157 nm), EUV (extreme ultraviolet radiation), electron beams, X-rays and soft X-rays is also being investigated.

Furthermore, with the rate of miniaturization development growing ever faster, levels of resolution capable of forming line and space patterns of no more than 100 nm, hole patterns of no more than 140 nm, and isolated patterns of no more than 70 nm are now being sought.

As a result, research and development is also focusing on the method of forming the resist pattern, in an effort to exceed the current resolution limits imposed by the resist material.

An example of one such miniaturization technique that has recently been proposed (for examples, see Japanese Unexamined Patent Application, First Publication No. 2000-356850, Japanese Unexamined Patent Application, First Publication No. 2000-188250) is the thermal flow process, wherein a resist pattern is formed using normal lithography techniques, and the resist pattern is then subjected to heat treatment to reduce the pattern size. Thermal flow is a method in which following formation of a resist pattern using photolithography techniques, the resist pattern is heated and softened, causing the pattern to flow towards the gaps in the pattern, thus reducing the size of the portions where the resist pattern is not formed (such as the hole diameter in a hole pattern, or the space width in a line and space (L&S) pattern).

On the other hand, one example of a known resist material that satisfies the high resolution requirements needed to enable reproduction of a pattern with very minute dimensions is a chemical amplification type resist composition comprising a base resin that can change alkali solubility thereof under the action of acid, and an acid generator that generates acid on exposure to light, dissolved in an organic solvent.

In KrF excimer laser lithography, positive resist compositions and the like comprising, as the base resin, a polyhydroxystyrene that has high transparency relative to KrF excimer laser radiation (248 nm) or a polyhydroxystyrene based resin in which a portion of the hydroxyl groups have been protected with an acid dissociable, dissolution inhibiting group are typically used as chemical amplification type resist compositions (for examples, see Japanese Unexamined Patent Application, First Publication No. Hei 4-211258, Japanese Unexamined Patent Application, First Publication No. 2002-287363). Examples of the most commonly used acid dissociable, dissolution inhibiting groups include so-called acetal groups, including chain-like ether groups such as 1-ethoxyethyl groups and cyclic ether groups such as tetrahydropyranyl groups, as well as tertiary alkyl groups such as tert-butyl groups, and tertiary alkbxycarbonyl groups such as tert-butoxycarbonyl groups.

In this type of positive resist composition comprising a polyhydroxystyrene based resin as the base resin, in order to achieve a high resolution resist pattern, the proportion of hydroxyl groups within the resin that are protected by acid dissociable, dissolution inhibiting groups is preferably high.

However, as the proportion of hydroxyl groups protected by acid dissociable, dissolution inhibiting groups is increased, the dissolution inhibiting effect strengthens. As a result, a problem arises in that the exposed portions do not dissolve satisfactorily in the developing liquid, and a residual scum is generated within the exposed portions. Furthermore, the occurrence of developing defects also becomes more prevalent.

Furthermore, this resin has substrate dependency, with scum generation being particularly marked in those cases where a nitrogen-containing substrate such as titanium nitride is used. In addition, depending on the property of the acid dissociable, dissolution inhibiting group, the level of hydrophobicity within the unexposed portions can increase, resulting in a deterioration in the compatibility with the rinse liquid used in the rinse step following developing, and causing residues to be left adhered to the unexposed portions.

Accordingly, there is a limit to how far the proportion of hydroxyl groups protected by acid dissociable, dissolution inhibiting groups can be increased, and obtaining a high resolution resist pattern, while suppressing the level of scum and developing defects has been difficult.

Furthermore, Japanese Unexamined Patent Application, First Publication No. 2002-287363 discloses a chemical amplification type positive resist composition with improved levels of scum suppression, in which polypropylene glycol is added to the base resin comprising a polymer of hydroxystyrene and 2-ethyl-2-adamantyl (meth)acrylate. However, although a positive resist using this polymer displays improved scum suppression, the resolution and depth of focus are not entirely satisfactory.

SUMMARY OF THE INVENTION

An object of the present invention is to provide a positive resist composition with excellent resolution and depth of focus, and superior suppression of scum and developing defects, as well as a method of forming a resist pattern that uses such a positive resist composition.

A first aspect of the present invention is A positive resist composition comprising: a resin (A) that increases alkali solubility of the resin due to action of an acid, wherein the resin comprises a copolymer containing a first structural unit (a1) derived from hydroxystyrene, and a second structural unit (a2) derived from a (meth)acrylate with an alcoholic hydroxyl group, and a weight average molecular weight of the copolymer is within a range from 2000 to 8500, and 10 mol % to 25 mol % of a combined total of hydroxyl groups within the structural units (a1) and alcoholic hydroxyl groups within the structural units (a2) are protected with acid dissociable, dissolution inhibiting groups; an acid generator (B) that generates an acid on exposure to light; and polypropylene glycol (C).

PREFERRED EMBODIMENTS

As follows is a more detailed description of the present invention.

A positive resist composition of the present invention comprises a resin (A) (hereafter referred to as the component (A)) that increases alkali solubility under the action of acid, an acid generator (B) (hereafter referred to as the component (B)) that generates acid on exposure to light, and polypropylene glycol (C) (hereafter referred to as the component (C)).

In the component (A), when acid is generated from the component (B) on exposure to light, the acid dissociable, dissolution inhibiting groups within the component (A) dissociate by the acid, causing the entire component (A) to change from an alkali insoluble state to an alkali soluble state. As a result, when a resist comprising them is exposed through a mask pattern during the formation of a resist pattern, or alternatively, is exposed and then subjected to a post exposure baking treatment, the exposed portions of the resist shift from an alkali insoluble state to an alkali soluble state, whereas the unexposed portions remain insoluble in alkali, meaning that alkali developing can then be used to form a positive resist pattern.

A characteristic of a positive resist composition of the present invention is the combination of a specific copolymer with the component (C). By combining this specific copolymer with the component (C), a resist pattern can be formed with excellent resolution and depth of focus, as well as improved suppression of scum and developing defects. Furthermore, the substrate dependency of scum occurrence is low, meaning the invention can be applied to any substrate. The reason for the improvement in scum suppression is thought to be a result of the component (C) promoting both the generation of acid from the component (B) in the exposed portions, and the dissociation of the acid dissociable, dissolution inhibiting groups, thereby suppressing the occurrence of residues (scum) that have not dissolved in the developing liquid.

Furthermore, by incorporating the component (C), the depth of focus broadens, and the focus margin during exposure also increases.

In addition, by incorporating the component (C), the flow temperature for a resist produced using the positive resist composition decreases. Therefore, if a thermal flow treatment is conducted following formation of the resist pattern, the treatment can be conducted at a lower temperature.

Furthermore, by employing a pattern formation method that includes a thermal flow treatment, a positive resist composition of the present invention can be used to form an ultra fine resist pattern of approximately 90 nm using KrF excimer laser exposure or the like. It is thought that the reason for this finding is than the heating causes a cross-linking reaction between the structural units (a1) and (a2) of the component (A), and therefore even if the composition does not contain a cross-linking agent (hereafter referred to as the component (F). and it is described in detail below), which may provide an adverse effect on the storage stability of the resist composition, a favorable flow rate can still be achieved.

<<Component (A)>>

In the present invention, the component (A) comprises a copolymer (hereafter referred to as the copolymer (A1)) containing a first structural unit (a1) derived from hydroxystyrene, and a second structural unit (a2) derived from a (meth)acrylate having an alcoholic hydroxyl group. The copolymer has a weight average molecular weight within a range from 2000 to 8500, and 10 mol % to 25 mol % of the combined total of hydroxyl groups within the structural units (a1) and alcoholic hydroxyl groups within the structural units (a2) are protected with acid dissociable, dissolution inhibiting groups.

In addition to the first structural unit (a1) and the second structural unit (a2), the copolymer (A1) may also comprise a third structural unit (a3) derived from styrene.

<First Structural Unit (a1)>

The first structural unit (a1) of the copolymer (A1) is a structural unit derived from hydroxystyrene, and is represented by a general formula (I) shown below. In other words, in this description, the term hydroxystyrene describes both the literal hydroxystyrene, as well as α-methylhydroxystyrene.

In the first structural unit (a1) represented by the general formula (I) shown below, the bonding position of the hydroxyl group may be the o-position, the m-position or the p-position, although from the viewpoints of availability and cost, the p-position is preferred.

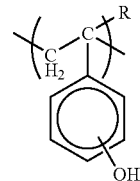

(I)

(wherein, R represents a hydrogen atom or a methyl group)

<Second Structural Unit (a2)>

The second structural unit (a2) of the copolymer (A1) is a structural unit derived from a (meth)acrylate containing at least one alcoholic hydroxyl group. The term (meth)acrylate ((meth)acrylste acid ester) is a generic term covering methacrylates and acrylates.

In the present invention, incorporation of the second structural unit (a2) causes the component (A) to have a lower solubility in an alkali developing liquid than a conventional resin in which a portion of the hydroxyl groups within a polyhydroxystyrene are protected by acid dissociable, dissolution inhibiting groups. As a result, a satisfactory level of insolubility in the alkali developing liquid can be achieved even if the component (A) has a lower specified protection rate of the groups than conventional resins, and this enables the resolution ability to be improved. Furthermore, due to the protection rate which is lower than in conventional resins, the level of scum occurrence also decreases.

In other words, in a conventional resin in which a portion of the hydroxyl groups within a polyhydroxystyrene are protected by acid dissociable, dissolution inhibiting groups, all the unprotected structural units are hydroxystyrene units. As a result, the solubility of such a resin in an alkali developing liquid is higher than that of the component (A) of the present invention. In the present invention, by including, instead of hydroxystyrene units, a structural unit which can introduce alcoholic hydroxyl groups with inferior alkali solubility into a portion of the base resin side chains, the solubility in alkali developing liquids can be reduced.

Provided the second structural unit (a2) produces this type of effect as described above, there are no particular restrictions on the structure, and any structural unit derived from a (meth)acrylate containing an alcoholic hydroxyl group is suitable. However, from the viewpoints of obtaining superior levels of resolution ability and dry etching resistance, structural units derived from a (meth)acrylate containing an aliphatic polycyclic group with an alcoholic hydroxyl group are preferred.

Examples of the aliphatic polycyclic group within this type of (meth)acrylate containing an aliphatic polycyclic group with an alcoholic hydroxyl group include groups in which one hydrogen atom has been removed from a bicycloalkane, a tricycloalkane, a tetracycloalkane and the like. Specific examples thereof include groups in which one hydrogen atom has been removed from a polycycloalkane such as adamantane, norbornane, isobornane, tricyclodecane or tetracyclododecane. This aliphatic polycyclic group can be appropriately selected from the multitude of groups proposed for use with ArF resists and the like. Of these groups, an adamantyl group, norbornyl group or tetracyclododecanyl group is preferred from an industrial viewpoint.

One example of a particularly suitable structure for the second structural unit (a2) is a structural unit derived from a (meth)acrylate containing an adamantyl group having at least one alcoholic hydroxyl group, as represented by a general formula (II) shown below.

Of the various second structural units (a2) represented by the general formula (II) shown below, the most preferred form is the structural unit represented by a general formula (IIa), also shown below.

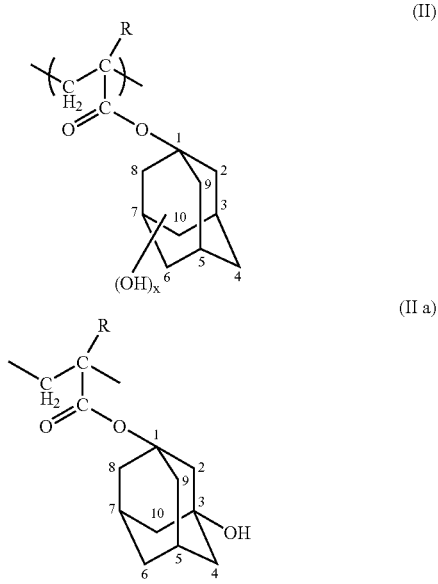

(wherein, R represents a hydrogen atom or a methyl group, and x represents an integer from 1 to 3)

<Acid Dissociable, Dissolution Inhibiting Group>

In the copolymer (A1), a portion of the total hydroxyl groups which include the hydroxyl groups within the first structural units (a1) and the alcoholic hydroxyl groups within the second structural units (a2) must be protected with acid dissociable, dissolution inhibiting groups.

The acid dissociable, dissolution inhibiting group can be appropriately selected from the multitude of groups that have been proposed as acid dissociable, dissolution inhibiting groups for use within conventional chemical amplification type KrF positive resist compositions and ArF positive resist compositions. Specific examples of these acid dissociable, dissolution inhibiting groups include chain-like or cyclic tertiary alkyl groups such as tert-butyl groups, tert-amyl groups, 1-methylcyclopentyl groups, 1-ethylcyclopentyl groups, 1-methylcyclohexyl groups, and 1-ethylcyclohexyl groups; cyclic ether groups such as tetrahydropyranyl groups and tetrahydrofuranyl groups; and 1-lower alkoxyalkyl groups represented by a general formula (III) shown below.

Of these, 1-lower alkoxyalkyl groups represented by the general formula (III) shown below are preferred.

The 1-lower alkoxyalkyl group represented by the general formula (III) is preferably a group in which the carbon 1 position of a straight chain, branched or cyclic alkyl group having 2 to 9 carbon atoms, and even more preferably 2 to 5 carbon atoms, is substituted with a straight chain, branched or cyclic alkoxy group of 1 to 8 carbon atoms, and even more preferably 2 to 6 carbon atoms.

Specific examples of such 1-lower alkoxyalkyl groups include straight chain or branched alkoxyalkyl groups such as 1-ethoxyethyl group and 1-isopropoxyethyl group, and cyclic alkoxyalkyl groups such as 1-cyclohexyloxyethyl group. Of these, 1-ethoxyethyl group is particularly preferred as they provide superior resolution properties.

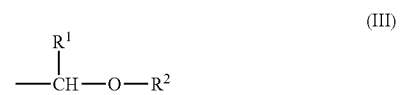

(wherein, $R^1$ represents an alkyl group having 1 to 8 carbon atoms, and $R^2$ represents either a straight chain or branched alkyl group having 1 to 8 carbon atoms, or a cycloalkyl group having 5 to 7 carbon atoms)

In the present invention, the hydroxyl group protection ratio within the copolymer (A1) falls within a range from 10 mol % to 25 mol %, and preferably from 15 mol % to 20 mol %, of the combined total of hydroxyl groups within the first structural units (a1) and alcoholic hydroxyl groups within the second structural units (a2).

By ensuring that the hydroxyl group protection ratio does not exceed the upper limit of the above range, the occurrence of scum and developing defects can be effectively prevented, whereas by ensuring a ratio that is greater than the lower limit of the above range, favorable resolution can be achieved.

There are no particular restrictions on the respective protection ratios for the hydroxyl groups within the structural units (a1), and the alcoholic hydroxyl groups within the structural units (a2). However, cases in which only hydroxyl groups of the first structural unit (a1) (that is, phenolic hydroxyl groups of hydroxystyrene units) are protected, or cases in which both hydroxyl groups within (a1) and alcoholic hydroxyl groups within (a2) are protected by acid dissociable, dissolution inhibiting groups, are preferred.

Furthermore, although somewhat dependent on the nature of the acid dissociable, dissolution inhibiting group, generally, cases in which both hydroxyl groups within (a1) and alcoholic hydroxyl groups within (a2) are protected by acid dissociable, dissolution inhibiting groups are the most desirable.

<Third Structural Unit (a3)>

A third structural unit (a3) of the copolymer (A1) is a structural unit derived from styrene, and is represented by a general formula (IV) shown below. In this description, the term styrene describes both the literal styrene, as well as α-methylstyrene.

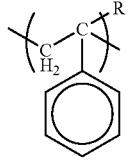

(wherein, R represents a hydrogen atom or a methyl group)

In the copolymer (A1), the molar ratio between the structural units (a1) and the structural units (a2), prior to protection with the acid dissociable, dissolution inhibiting groups, that is the ratio of first structural units (a1):second structural units (a2) is preferably within a range from 85:15 to 70:30, and even more preferably from 82:18 to 78:22. If the proportion of the structural unit (a2) exceeds the above range, then the solubility of the composition in the developing liquid is insufficient, whereas if the proportion is lower than the above range, then the effects achieved by using the structural unit (a2) do not manifest adequately.

Furthermore, in the component (A), the combined total of the structural units (a1) and the structural units (a2) within the copolymer (A1), prior to protection with the acid dissociable, dissolution inhibiting groups, is preferably 90 mol % or more of the entire copolymer (A1). If the proportion is lower than this, then the resolution tends to deteriorate. The combined total of the structural units (a1) and the structural units (a2) is even more preferably 95 mol % or more, and may even be 100 mol %.

In the present invention, the structural unit (a3) is not essential component. However, inclusion of the structural unit (a3) offers various advantages, including an improvement in the depth of focus, and an improvement in the dry etching resistance.

If used, quantity of the structural unit (a3) is preferably 0.5 to 10 mol %, and even more preferably from 2 to 5 mol % of all the structural units within the copolymer (A1). If the proportion of the third structural unit (a3) exceeds the above range, then the solubility of the composition in the developing liquid tends to deteriorate.

The weight average molecular weight (Mw: the polystyrene equivalent value determined by gel permeation chromatography, this also applies to all subsequent weight average molecular weight values) of the copolymer (A1) comprising the first structural unit (a1) and the second structural unit (a2) as essential structural units, prior to protection of a portion of the hydroxyl groups with acid dissociable, dissolution inhibiting groups, is required to be within a range from 2000 to 8500, and is preferably from 4500 to 8500. Ensuring a Mw value of at least 2000 enables a resist with excellent etching resistance and heat resistance to be obtained. Furthermore, ensuring a Mw value of no more than 8500 enables the occurrence of scum to be reduced. It is also prevents the occurrence of microbridging. In this description, microbridging refers to one type of developing defect, wherein in the case of a line and space pattern for example, portions of adjacent resist patterns which sit close to one another and are vicinity of the surface become bridged by strands of resist. Microbridging becomes more prevalent as the value of Mw increases, or as the temperature of the post exposure baking (PEB) during resist pattern formation is increased.

Furthermore, when a copolymer (A1) is a monodisperse copolymer and the dispersity (Mw/Mn ratio) thereof prior to protection of a portion of the hydroxyl groups with the acid dissociable, dissolution inhibiting group is relatively small, superior resolution can be obtained preferably. Specifically, the Mw/Mn ratio is preferably no more than 2.0, and even more preferably 1.8 or smaller.

The copolymer (A1) can be produced, for example, by copolymerizing a monomer that corresponds with the structural unit (a1) without the hydroxyl group protected, and a monomer that corresponds with the structural unit (a2) without the hydroxyl group protected, and then using a conventional method to protect a portion of the hydroxyl groups of the structural units (a1) and/or the structural units (a2) with acid dissociable, dissolution inhibiting groups.

Furthermore, the copolymer (A1) can also be produced by preparing a monomer that corresponds with a structural unit (a1) in which the hydroxyl group has already been protected with an acid dissociable, dissolution inhibiting group, conducting a typical copolymerization of this monomer and a monomer that corresponds with the structural unit (a2), subsequently using hydrolysis to convert a portion of the hydroxyl groups that have been protected with acid dissociable, dissolution inhibiting groups back to hydroxyl groups, and if required, using a conventional method to protect a portion of the hydroxyl groups of the structural units (a2) with acid dissociable, dissolution inhibiting groups.

In addition to the copolymer (A1) described above, the component (A) may also comprise, in accordance with the type of exposure light source used during resist pattern formation, other materials that have been proposed as suitable base resins for conventional chemical amplification type KrF positive resist compositions and ArF positive resist compositions, in so far as the inclusion of such materials does not impair the effects of the present invention.

The proportion of the copolymer (A1) in the component (A) is preferably within a range from 80 to 100% by mass, and is most preferably 100% by mass.

The quantity of the component (A) within a positive resist composition of the present invention can be adjusted in accordance with the thickness of the resist film that is desired. Typically, the quantity of the component (A), expressed as a solid fraction concentration, is within a range from 8 to 25% by mass, and preferably from 10 to 20% by mass.

<<Component (B)>>

In the present invention, any of the materials typically used as acid generators in conventional chemical amplification type resists can be used as the acid generator-(B).

Of these materials, diazomethane based acid generators and onium salts are preferred.

Specific examples of suitable diazomethane based acid generators include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Specific examples of suitable onium salts include diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, and triphenylsulfonium nonafluorobutanesulfonate. Among the various onium salts, onium salts with a fluorinated alkylsulfonate ion as the anion are preferred.

Diazomethane based acid generators are preferred in those cases where the resist composition of the present invention is used on top of a neutral anti-reflective film, as they enable formation of a superior shape. Onium salts are preferred in those cases where the resist composition of the present invention is used on top of an acidic anti-reflective film, as they enable formation of a superior shape.

As the component (B), either a single acid generator, or a combination of two or more different acid generators may be used.

The quantity of the component (B) is typically within a range from 1 to 20 parts by mass, and preferably from 2 to 10 parts by mass, per 100 parts by mass of the component (A). If the quantity is lower than the above range, then pattern formation does not progress satisfactorily, whereas if the quantity exceeds the above range, it becomes difficult to achieve a uniform solution, and there is a danger of a deterioration in the storage stability of the composition.

<<Component (C)>>

There are no particular restrictions on the quantity of the component (C) used in a positive resist composition of the present invention. However, the quantity is typically within a range from 0.1 to 10% by mass, and preferably from 0.5 to 3% by mass, relative to that of the component (A). Ensuring a quantity of at least 0.1% by mass enables a high resolution and a favorable scum reduction effect to be achieved. Furthermore, the flow temperature of a resist obtained using the positive resist composition can be reduced to a temperature more suited to thermal flow treatment. In contrast, if the quantity exceeds 10% by mass, then there is a danger of a deterioration in the depth of focus characteristics.

Furthermore, the Mw of the component (C) is preferably within a range from 200 to 4000, and more preferably from 1000 to 3000. If the Mw value is at least 200, then a composition with excellent etching resistance and heat resistance is obtained. Moreover, if the Mw value is no more than 4000, then the occurrence of scum can be effectively suppressed, resulting in a superior composition.

<<Other Components>>

<Nitrogen Containing Organic Compound (D)>

In a positive resist composition of the present invention, in order to improve the resist pattern shape and the long term stability (post exposure stability of the latent image formed by the pattern wise exposure of the resist layer), a nitrogen containing organic compound can also be added as a optional component. A multitude of these nitrogen containing organic compounds have already been proposed, and any of these known compounds can be used. Among these compounds, a secondary lower aliphatic amine or a tertiary lower aliphatic amine is preferred.

Here, a lower aliphatic amine refers to an alkyl or alkyl alcohol amine of no more than 5 carbon atoms. Examples of these secondary and tertiary amines include trimethylamine, diethylamine, triethylamine, di-n-propylamine, tri-n-propylamine, tripentylamine, diethanolamine and triethanolamine. Of these, alkanolamines such as triethanolamine are particularly preferred.

These compounds may be used singularly, or in combinations of two or more different compounds.

This amine is typically added in a quantity within a range from 0.01 to 1.0% by mass relative to the component (A).

Furthermore, in order to prevent any deterioration in sensitivity caused by the addition of the aforementioned component (D), and improve the resist pattern shape and the long term stability, an organic carboxylic acid, or a phosphoric oxo acid or derivative thereof can also be added as an optional component (E).

The component (D) and the component (E) can either be used in combination, or either one of the two components can be used.

Examples of suitable organic carboxylic acids include malonic acid, citric acid, malic acid, succinic acid, benzoic acid, and salicylic acid.

Examples of suitable phosphoric oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid. Of these, phosphonic acid is particularly preferred.

The component (E) is typically used in a quantity within a range from 0.01 to 5.0 parts by mass per 100 parts by mass of the component (A).

<Cross-Linking Agent (F)>

In those cases where the positive resist composition of the present invention is used in a process that includes a thermal flow treatment described below, the composition may also comprise a cross-linking agent (F) (hereafter referred to as the component (F)).

This component (F) is a component that reacts with the component (A) on heating and generates cross-linking, and any of the materials already known as suitable cross-linking agents for chemical amplification type resist compositions suited to thermal flow treatment can be used.

As the component (F), compounds having at least two cross-linkable vinyl ether groups can be used. Examples thereof include polyoxyalkylene glycols such as alkylene glycols, dialkylene glycols and trialkylene glycols, or polyhydric alcohols such as trimethylolpropane, pentaerythritol and pentaglycol, in which at least two hydroxyl groups have been substituted with vinyl ether groups. One specific example of a preferred component (F) is cyclohexyldimethanol divinyl ether.

If used, the quantity of the component (F) is typically within a range from 0.1 to 25% by mass, and preferably from 1 to 15% by mass, based on the component (A). The component (F) can use either a single compound, or a combination of two or more different compounds.

<Other Optional Components>

Other miscible additives can also be added to a positive resist composition of the present invention according to need, and examples thereof include additive resins for improving the properties of the resist film, surfactants for improving application ability, dissolution inhibitors, plasticizers, stabilizers, colorants and halation prevention agents.

<Organic Solvent>

A positive resist composition according to the present invention can be produced by dissolving the essential components, namely the component (A), the component (B) and the component (C), together with any optional components such as the component (D), the component (E) and the component (F), in an organic solvent. If required, each component can be mixed individually with a solvent, and these individual solutions then combined.

The organic solvent may be any solvent capable of dissolving the various components to generate a uniform solution, and one or more solvents selected from known materials used as the solvents for conventional chemical amplification type resists can be used.

Specific examples of the solvent include ketones such as acetone, methyl ethyl ketone, cyclohexanone, methyl isoaniyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methylpyruvate, ethyl pyruvate, methyl methoxypropionate, and ethyl ethoxypropionate. These organic solvents can be used singularly, or as a mixed solvent containing two or more different solvents.

In particular, mixed solvents of propylene glycol monomethyl ether acetate (PGMEA), and a polar solvent containing a hydroxyl group or a lactone such as propylene glycol monomethyl ether (PGME), ethyl lactate (EL) or γ-butyrolactone offer improved levels of storage stability for the positive resist composition, and are consequently preferred. In the case of a mixed solvent with EL, the mass ratio PGMEA:EL is preferably within a range from 6:4 to 4:6.

A positive resist composition of the present invention is particularly useful for KrF excimer lasers, although it is also effective for other types of radiation of shorter wavelength such as ArF excimer lasers, $F_2$ excimer lasers, EUV (extreme ultraviolet radiation), VUV (vacuum ultraviolet radiation), electron beams, X-rays and soft X-rays.

A resist pattern produced using a positive resist composition of the present invention with the type of structure described above has high resolution, and the occurrence of scum and developing defects reduces. Furthermore, the focus margin for the depth of focus during exposure to light is also large. In addition, if thermal flow treatment is conducted following developing of the resist pattern, then the treatment temperature can be lowered.

<<Method of Forming a Resist Pattern>>

A method of forming a resist pattern according to the present invention can be conducted in the manner described below, using an aforementioned positive resist composition of the present invention.

A resist composition of the present invention is first applied to the surface of a substrate such as a silicon wafer using a spinner or the like. A prebake is then conducted under temperature conditions of 90 to 120° C. for a period of 40 to 120 seconds, and preferably for 60 to 90 seconds, thereby forming a resist film. The resist film is then selectively exposed with a KrF excimer laser through a desired mask pattern using, for example, a KrF exposure apparatus. Subsequently, PEB (post exposure baking) is conducted under temperature conditions of 90 to 120° C. for a period of 40 to 120 seconds, and preferably for 60 to 90 seconds.

Subsequently, developing is conducted using an alkali developing liquid such as an aqueous solution of tetramethylammonium hydroxide with a concentration of 0.05 to 10% by mass, and preferably from 0.05 to 3% by mass. A rinse treatment is then conducted to wash away and remove any developing liquid left on the surface of the substrate, together with the resist composition that have dissolved in the developing liquid, and the resist is then dried. In this manner, a resist pattern that is faithful to the mask pattern can be obtained. A postbake may also be conducted.

A positive resist composition of the present invention has minimal substrate dependency, and is resistant to scum generation. Accordingly, there are no particular restrictions on the support, and conventional materials can be used as a support. Furthermore, the invention can also be applied to nitrogen-containing substrates such as titanium nitride, which have conventionally been particularly prone to scum generation.

Examples of suitable conventional substrates include the types of substrates used for electronic componentry, including substrates with a predetermined wiring pattern formed thereon.

Specific examples of the substrate include silicon wafers, metal substrates such as, copper, chrome, steel or aluminum, as well as other substrates such as glass.

Examples of suitable materials for the aforementioned wiring pattern include copper, solder, chrome, aluminum, nickel and gold.

An organic or inorganic anti-reflective film may also be provided between the substrate and the applied layer of the resist composition.

In a method of forming a resist pattern according to the present invention, a step is preferably provided for subjecting a resist pattern formed in the above manner to thermal flow treatment, thus obtaining the resist pattern narrowed.

Thermal flow treatment is conducted by heating the resist pattern at least once. Increasing the number of heating repetitions enables the degree of variation in the resist pattern size per unit of temperature (hereafter referred to as the flow rate) to be reduced, and is consequently preferred. On the other hand, the number of steps increases, and the time required for the treatment increases, which causes a lowering of the throughput.

Lower flow rates in the thermal flow treatment produce a higher level of in-plane uniformity for the pattern dimensions of the narrowed resist pattern formed on the wafer, and the cross sectional shape of the resist pattern is also superior. If the thickness of the resist is 1000 nm or less, then the film thickness has almost no effect on the flow rate.

The heating temperature used in the thermal flow treatment is selected in accordance with the composition of the resist pattern, and is typically selected within a range from 100 to 200° C., and preferably from 110 to 180° C. In those cases where 2 or more heating steps are conducted, the second and any subsequent heating steps are conducted at either the same temperature as, or a higher temperature than, the first heating step.

There are no particular restrictions on the heating time, provided it does not hinder throughput, and yields the desired resist pattern size. Typically, each heating step is conducted for a time within a range from 30 to 270 seconds, and preferably from 60 to 120 seconds.

A resist pattern produced by a method of forming a resist pattern according to the present invention is produced using a positive resist composition of the present invention, and consequently has high resolution, and a reduction in the occurrence of scum and developing defects is achieved. Furthermore, the focus margin for the depth of focus during exposure is also large.

Furthermore, a method of forming a resist pattern that employs thermal flow treatment can be favorably used in the formation of the types of ultra fine resist patterns that are difficult to form using typical methods, such as using a KrF excimer laser to form line and space patterns of no more than 120 nm, and hole patterns of no more than 140 nm. The finest resist pattern sizes that can be formed include in the order of 90 nm.

EXAMPLES

As follows is a more detailed description of the present invention, based on a series of examples. The present invention is in no way restricted to the examples presented below.

Example 1

First, the component (A) was prepared. Namely, a copolymer formed from p-hydroxystyrene and the adamantol methacrylate of the above general formula (IIa) in which R is a methyl group (molar ratio of p-hydroxystyrene and adamantol methacrylate 8:2, Mw 8500, Mw/Mn 1.78), and ethyl vinyl ether were reacted together by normal methods in the presence of an acid catalyst, thus forming a resin in which some of the hydroxyl groups of the copolymer had been protected with 1-ethoxyethyl groups, and this resin was used as the component (A).

When this resin was analyzed by $^1$H-NMR, the quantity of 1-ethoxyethoxy groups relative to the total number of hydroxyl groups within the p-hydroxystyrene and adamantol that were used was 20%. This indicates a protection ratio for the hydroxyl groups of 20%.

100 parts by mass of this component (A), 10 parts by mass of bis(cyclohexylsulfonyl)diazomethane and 2 parts by mass of triphenylsulfonium trifluoromethanesulfonate as the component (B), 1.5 parts by mass of polypropylene glycol (Mw 1000) as the component (C), and 0.24 parts by mass of triethanolamine and 0.03 parts by mass of triisopropanolamine as the component (D) were dissolved in a mixed solvent of PGMEA and EL (with a mass ratio PGMEA:EL of 6:4), and obtained a positive resist composition so that the combination of components (A) through (D) was 500 parts by mass.

Meanwhile, a substrate was prepared by layering an organic anti-reflective film (brand name DUV-44, manufactured by Brewer Science Ltd.) on top of an 8 inch diameter silicon wafer, and then heating at 205° C. to form a film of thickness 65 nm.

The positive resist composition obtained above was applied to the surface of the substrate using a spinner. The composition was then prebaked and dried on a hotplate at 100° C. for 90 seconds, forming a resist layer with a film thickness of 410 nm.

This layer was then irradiated with a KrF excimer laser (248 nm) through a 6% half tone (H.T.) reticle, using a KrF scanner NSR-S203B (manufactured by Nikon Corporation, NA (numerical aperture)=0.68, ⅔ annular illumination). The irradiated resist was then subjected to PEB treatment at 100° C. for 60 seconds. Subsequently, the resist was subjected to puddle development for 60 seconds at 23° C. in a 2.38% by mass aqueous solution of tetramethylammonium hydroxide, and was then rinsed by washing for 15 seconds with pure water. The resist was then shaken dry, and then further dried by heating at 100° C. for 60 seconds, thus forming a resist pattern.

In this manner, a 100 nm line and space pattern of good shape was formed. Furthermore, inspection of the surface state of the substrate on which the resist pattern had been formed (for the presence of scum and residue and the like) using a measuring SEM revealed no scum or residues. Furthermore, inspection of the resist pattern using a surface defect inspection apparatus manufactured by KLA Tencor Corporation (KLA2132) revealed none of the developing defect known as microbridging. The depth of focus range was 0.4 µm.

Comparative Example 1

With the exception of not adding the polypropylene glycol from the example 1, a resist composition was prepared in the same manner as the example 1, and the same method was then used to form a resist pattern.

In this manner, a resist hole pattern with a hole diameter of 150 nm was formed. When the surface state of the substrate on which the resist pattern had been formed was inspected (for the presence of scum and residue and the like) using a measuring SEM, both scum and residues were observed. Furthermore, inspection of the resist pattern using a surface defect inspection apparatus manufactured by KLA Tencor Corporation (KLA2132) revealed no microbridging. The depth of focus range was 0.6 µm.

Comparative Example 2

With the exception of altering the copolymer as described below, a resist composition was prepared in substantially the same manner as the example 1. Namely, a copolymer formed from p-hydroxystyrene and the adamantol methacrylate of the above general formula (IIa) in which R is a methyl group (molar ratio of p-hydroxystyrene and adamantol methacrylate 9:1, Mw 10,000, Mw/Mn 2.2), and ethyl vinyl ether were reacted together by normal methods in the presence of an acid catalyst, thus forming a resin in which some of the hydroxyl groups of the copolymer had been protected with 1-ethoxyethyl groups, and this resin was used as the component (A).

When this resin was analyzed by $^1$H-NMR, the quantity of 1-ethoxyethoxy groups relative to the total number of hydroxyl groups within the p-hydroxystyrene and adamantol that were used was 40%. This indicates a protection ratio for the hydroxyl groups of 40%.

100 parts by mass of this component (A), 10 parts by mass of bis(cyclohexylsulfonyl)diazomethane and 2 parts by mass of triphenylsulfonium trifluoromethanesulfonate as the component (B), 1.5 parts by mass of polypropylene glycol (Mw 1000) as the component (C), and 0.24 parts by mass of triethanolamine and 0.03 parts by mass of triisopropanolamine as the component (D) were dissolved in a mixed solvent of PGMEA and EL (with a mass ratio PGMEA:EL of 6:4), and obtained a positive resist composition so that the combination of components (A) through (D) was 500 parts by mass.

Using this resist composition, when a resist pattern was formed in the same manner as the example 1, a hole pattern with a hole diameter of 150 nm was formed, although the pattern was unsatisfactory, with significant film thinning of the unexposed portions. The depth of focus range was 0.7 µm. When the surface state of the substrate on which the resist pattern had been formed was inspected (for the presence of scum and residue and the like) using a measuring SEM, no scum or residues were observed. However, inspection of the resist pattern using a surface defect inspection apparatus manufactured by KLA Tencor Corporation (KLA2132) revealed the occurrence microbridging.

Example 2

The same positive resist composition as the example 1 was prepared. Meanwhile, a substrate was prepared by layering an organic anti-reflective film (trade name DUV-44, manufactured by Brewer Science Ltd.) on top of an 8 inch silicon wafer, and then heating at 205° C. to form a film of thickness 65 nm.

The positive resist composition obtained above was applied to the surface of the substrate using a spinner. The composition was then prebaked and dried on a hotplate at 100° C. for 90 seconds, forming a resist layer with a film thickness of 560 nm.

This layer was then irradiated by phase shift method with a KrF excimer laser (248 nm) through a 8% half tone (H.T.) reticle, using a KrF scanner NSR-S203B (manufactured by Nikon Corporation, NA (numerical aperture)=0.68, ⅔ annular illumination). The irradiated resist was then subjected to PEB treatment at 110° C. for 60 seconds. Subsequently, the resist was subjected to puddle development for 60 seconds at 23° C. in a 2.38% by mass aqueous solution of tetramethylammonium hydroxide, and was then rinsed for 15 seconds with pure water. The resist was then shaken dry, and then further dried by heating at 100° C. for 60 seconds, thus forming a resist hole pattern with a hole diameter of 150 nm.

Subsequently, thermal flow treatment was performed on the substrate comprising the resist hole pattern, by heating the substrate to a predetermined temperature using a hotplate, thus producing a narrowed resist hole pattern.

The flow rate was determined by altering the heating conditions used in the thermal flow treatment, while measuring the dimensions of the resulting resist hole pattern. In other words, five of the above substrates with a resist hole pattern of diameter 150 nm formed thereon were prepared in the manner described above, and these substrates were heated for 90 seconds at 150° C., 155° C., 160° C. or 165° C. respectively. At each temperature, the heating caused a narrowing of the resist hole pattern, yielding a narrowed resist hole pattern of favorable shape, although the hole diameter following narrowing varied depending on the heating temperature used. A graph was prepared showing temperature along the horizontal axis, and the degree of dimensional variation in the resist pattern (the variation in the hole diameter) at each temperature along the vertical axis, and this graph was used to determine the resist pattern dimensional variation per unit of temperature variation (° C.), namely the flow rate, at the point where the resist pattern dimension (the hole diameter) after narrowing was 90 nm.

The resist pattern dimensions (hole diameters) after narrowing were 122 nm at 150° C., and 88 nm at 155° C., whereas at temperatures of 160° C. or higher, the hole of the pattern was collapsed and filled in. The flow rate required for a narrowed hole diameter of 90 nm was 4 nm/° C.

Comparative Example 3

Using the resist composition used in the comparative example 1, thermal flow treatment was conducted in the same manner as the example 2.

The resist pattern dimensions (hole diameters) after narrowing were 143 nm at 150° C., 143 nm at 155° C., 131 nm at 160° C., and 119 nm at 165° C., and it is evident that in comparison with the example 2, the dimensional variation per unit of temperature variation (° C.) was smaller.

Example 3

100 parts by mass of the component (A) used in the example 1, 2 parts by mass of triphenylsulfonium nonafluorobutanesulfonate and 3 parts by mass of triphenylsulfonium trinonafluorobutanesulfonate as the component (B), 0.5 parts by mass of propylene glycol (Mw 1000) as the component (C), and 0.27 parts by mass of triethanolamine and 0.09 parts by mass of triisopropanolamine as the component (D) were dissolved in a mixed solvent of PGMIEA and EL (with a mass ratio PGMEA:EL of 6:4) so that the combination of components (A) through (D) reached 500 parts by mass, thus yielding a positive resist composition.

Meanwhile, a substrate was prepared by layering an organic anti-reflective film (trade name DUV-42, manufactured by Brewer Science Ltd.) on top of an 8 inch silicon wafer, and then heating to form a film of thickness 65 nm.

The positive resist composition obtained above was applied to the surface of the substrate using a spinner. The composition was then prebaked and dried on a hotplate at 100° C. for 60 seconds, forming a resist layer with a film thickness of 270 nm.

This layer was then irradiated with a KrF excimer laser (248 nm) through a 6% half tone (H.T.) reticle, using a KrF scanner NSR-S205C (manufactured by Nikon Corporation, NA (numerical aperture)=0.75, ⅔ annular illumination). The irradiated resist was then subjected to PEB treatment at 110° C. for 60 seconds. Subsequently, the resist was subjected to puddle development for 60 seconds at 23° C. in a 2.38% by mass aqueous solution of tetramethylammonium hydroxide, and was then rinsed for 15 seconds with pure water. The resist was then shaken dry, and then further dried by heating at 100° C. for 60 seconds, thus forming a resist pattern.

In this manner, a 110 nm line and space pattern was formed. Furthermore, inspection of the surface state of the substrate on which the resist pattern had been formed (for the presence of scum and residue and the like) using a measuring SEM revealed no scum or residues. Furthermore, inspection of the resist patter using a surface defect inspection apparatus manufactured by KLA Tencor Corporation (KLA2132) revealed none of the developing defect known as microbridging. The depth of focus range was 0.4 μm.

As described above, a positive resist composition of the present invention enables a favorable level of resolution to be achieved, and also enables the occurrence of scum to be reduced.

According to a method of forming a resist pattern according to the present invention, the resolution is high, the depth of focus range is broad, and the occurrence of scum and developing defects can be prevented. As a result, even in those cases where thermal flow treatment is conducted following formation of the resist pattern, the resulting resist pattern narrowed also displays high resolution and no occurrence of scum.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

The invention claimed is:

1. A positive resist composition comprising:
a resin (A) that increases alkali solubility of the resin due to action of an acid, wherein the resin comprises a copolymer containing a first structural unit (a1) derived from hydroxystyrene, and a second structural unit (a2) derived from a (meth)acrylate with an alcoholic hydroxyl group, and a weight average molecular weight of the copolymer is within a range from 2000 to 8500, and 10 mol% to 25 mol% of a combined total of hydroxyl groups within the structural units (a1) and alcoholic hydroxyl groups within the structural units (a2) are protected with acid dissociable, dissolution inhibiting groups; an acid generator (B) that generates an acid on exposure to light; and polypropylene glycol (C), provided that the hydroxyl groups within (a1) and the alcoholic hydroxyl groups within (a2) are both partially protected by the acid dissociable, dissolution inhibiting groups.

2. A positive resist composition according to claim 1, wherein a quantity of the polypropylene glycol (C) is within a range from 0.1 to 10% by mass relative to the component (A).

3. A positive resist composition according to claim 1, wherein a molar ratio between the structural units (a1) and the structural units (a2) of the copolymer comprised in the resin (A), prior to protection with the acid dissociable, dissolution inhibiting groups, is within a range from 85:15 to 70:30.

4. A positive resist composition according to claim 1, wherein the structural unit (a2) is a structural unit derived from a (meth)acrylate containing an aliphatic polycyclic group with an alcoholic hydroxyl group.

5. A positive resist composition according to claim 4, wherein the structural unit (a2) is a structural unit derived from a (meth)acrylate containing an adamantyl group with an alcoholic hydroxyl group.

6. A positive resist composition according to claim 1, wherein the acid dissociable, dissolution inhibiting group is a 1-lower alkoxyalkyl group.

7. A positive resist composition according to claim 1, wherein the copolymer comprised in the component (A) also comprises a third structural unit (a3) derived from styrene.

8. A positive resist composition according to claim 1, wherein polydispersity of the copolymer comprised in the component (A), prior to protection with the acid dissociable, dissolution inhibiting groups, is no more than 2.0.

9. A positive resist composition according to claim 1, wherein the acid generator (B) comprises at least one of a diazomethane based acid generator and an onium salt.

10. A positive resist composition according to claim 1, farther comprising a nitrogen containing organic compound (D).

11. A method of forming a resist pattern comprising the steps of: forming a positive resist film on a substrate using a positive resist composition according to claim 1; performing selective exposure to light of the positive resist film; conducting post exposure baking; and performing alkali developing to form a resist pattern.

12. A method of forming a resist pattern according to claim 11, further comprising an additional step of subjecting the resist pattern to thermal flow treatment to narrow the resist pattern, following the alkali developing to form a resist pattern.

* * * * *

UNITED STATES PATENT AND TRADEMARK OFFICE
CERTIFICATE OF CORRECTION

PATENT NO. : 7,402,372 B2
APPLICATION NO. : 10/865040
DATED : July 22, 2008
INVENTOR(S) : Hagihara et al.

It is certified that error appears in the above-identified patent and that said Letters Patent is hereby corrected as shown below:

Page 1, Inventor address for Mitsuo Hagihara, delete "Kawasakai" and insert -- Kawasaki --, therefor.

Page 1, Inventor address for Taku Nakao, delete "Kawasakai" and insert -- Kawasaki --, therefor.

Column 2, line 4, delete "alkbxycarbonyl" and insert -- alkoxycarbonyl --, therefor.

Column 3, line 50, (Approx.) delete "than" and insert -- that --, therefor.

Column 3, line 53, delete "(F)." and insert -- (F), --, therefor.

Column 4, line 33, delete "((meth)acrylste" and insert -- ((meth)acrylate --, therefor.

Column 8, line 34, delete "generator-(B)." and insert -- generator (B). --, therefor.

Column 10, line 60, delete "isoaniyl" and insert -- isoamyl --, therefor.

Column 11, line 1, delete "methylpyruvate," and insert -- methyl pyruvate, --, therefor.

Column 15, line 53, delete "PGMIEA" and insert -- PGMEA --, therefor.

Column 16, line 15, delete "patter" and insert -- pattern --, therefor.

Column 18, line 5, in Claim 10, delete "farther" and insert -- further --, therefor.

Signed and Sealed this

Twenty-first Day of April, 2009

JOHN DOLL
*Acting Director of the United States Patent and Trademark Office*